United States Patent
Wang et al.

(10) Patent No.: US 9,293,535 B2
(45) Date of Patent: Mar. 22, 2016

(54) POWER MOSFET CURRENT SENSE STRUCTURE AND METHOD

(75) Inventors: Peilin Wang, Beijing (CN); Jingjing Chen, Beijing (CN); Edouard D. de Fresart, Tempe, AZ (US); Pon Sung Ku, Gilbert, AZ (US); Wenyi Li, Beijing (CN); Ganming Qin, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/610,901

(22) Filed: Sep. 12, 2012

(65) Prior Publication Data

US 2014/0070313 A1    Mar. 13, 2014

(30) Foreign Application Priority Data

Jun. 12, 2012    (CN) .......................... 2012 1 0305062

(51) Int. Cl.
| | |
|---|---|
| H01L 29/66 | (2006.01) |
| H01L 29/10 | (2006.01) |
| H01L 29/423 | (2006.01) |
| H01L 29/78 | (2006.01) |
| H01L 29/06 | (2006.01) |
| H01L 29/08 | (2006.01) |

(52) U.S. Cl.
CPC ........ *H01L 29/1095* (2013.01); *H01L 29/0696* (2013.01); *H01L 29/0865* (2013.01); *H01L 29/4238* (2013.01); *H01L 29/66734* (2013.01); *H01L 29/7815* (2013.01)

(58) Field of Classification Search
CPC .................................................. H01L 29/4238
USPC ............................................ 257/331, E27.014
See application file for complete search history.

(56) References Cited

U.S. PATENT DOCUMENTS

| | | | |
|---|---|---|---|
| 5,629,543 A * | 5/1997 | Hshieh et al. | .................. 257/330 |
| 5,691,555 A | 11/1997 | Zambrano | |
| 6,144,085 A | 11/2000 | Barker | |
| 7,368,784 B2 | 5/2008 | Botti | |
| 7,554,152 B1 | 6/2009 | Ranucci | |
| 7,875,541 B2 | 1/2011 | Tai | |
| 7,939,882 B2 | 5/2011 | Su | |
| 7,977,739 B2 | 7/2011 | Kachi | |
| 2005/0272209 A1 | 12/2005 | Yedinak | |
| 2009/0250770 A1 | 10/2009 | Su | |
| 2010/0320461 A1 * | 12/2010 | Su et al. | .......................... 257/48 |
| 2011/0001189 A1 | 1/2011 | Challa | |

* cited by examiner

*Primary Examiner* — Hsin-Yi Hsieh
(74) *Attorney, Agent, or Firm* — Charles E. Bergere

(57) ABSTRACT

A power MOSFET has a main-FET (MFET) and an embedded current sensing-FET (SFET). MFET gate runners are coupled to SFET gate runners by isolation gate runners (IGRs) in a buffer space between the MFET and the SFET. In one embodiment, n IGRs (i=1 to n) couple n+1 gates of a first portion of the MFET (304) to n gates of the SFET. The IGRs have zigzagged central portions where each SFET gate runner is coupled via the IGRs to two MFET gate runners. The zigzagged central portions provide barriers that block parasitic leakage paths, between sources of the SFET and sources of the MFET, for all IGRs except the outboard sides of the first and last IGRs. These may be blocked by increasing the body doping in regions surrounding the remaining leakage paths. The IGRs have substantially no source regions.

13 Claims, 11 Drawing Sheets

_US 9,293,535 B2_

POWER MOSFET CURRENT SENSE STRUCTURE AND METHOD

BACKGROUND OF THE INVENTION

The present invention generally relates to semiconductor devices and circuits and methods for fabricating semiconductor devices and circuits, and more particularly to metal-oxide-semiconductor (MOS) field effect transistors (FETs) that incorporate a current sensor.

Metal-oxide-semiconductor field effect transistors (MOSFETs) are much used in modern electronics as individual devices and as part of various integrated circuits (ICs). Particularly demanding applications of MOSFETs occur where they are intended to control large amounts of power, e.g., heavy currents. This type of MOSFET is generally referred to as a "power MOSFET". It is known to incorporate a current sensor within a power MOSFET to provide a measurement of the amount of current being conducted by the power MOSFET. In many cases, the output of the current sensor is used to limit the current being conducted by the power MOSFET so that the power MOSFET is protected from damage from over-current conditions. Comparatively small MOSFETs are widely used as current sensing devices for power MOSFETs. For convenience, such devices are referred to as sensing FETs or SFETs. Such SFETs may also be referred to as "mirror" devices. In general, the SFET and the power MOSFET share common gate and drain terminals, but independent source terminals. In this way, the current flowing through the source terminal of the SFET can provide a measure of the current flowing through the source terminal of the power MOSFET. For convenience, the main part of the power MOSFET (not counting the SFET) is referred to herein as the "main FET" or MFET.

An important parameter of an SFET is what is referred to as the current sense ratio (CSR), that is, the ratio between the current flowing through the SFET current sensor to the current flowing through the MFET when subjected to substantially the same terminal voltages. In general, the CSR is a property of the device geometry, as for example, the ratio of the active area of the two devices, a ratio that is defined when the devices are designed. However, the CRS is affected by more than just device geometry. For example, the CSR can vary as a function of the temperatures of the main and sensing devices. It is known that the temperature variation in a CSR can be reduced by placing the SFET on the same die or chip or other substrate as the power MOSFET itself so that they are thermally coupled and tend to maintain similar temperatures. The thermal coupling is maximized by placing the SFET within rather than alongside the MFET. However, in that case, electrical isolation of the SFET and the MFET is difficult. In the prior art, such electrical isolation has typically been achieved by placing various doped regions or other forms of isolation walls or combinations thereof between the SFET and the MFET. However, this can significantly increase the overall device area and hence its cost. Accordingly, a need continues to exist for improved power MOSFETs incorporating MFETs and SFETs, and manufacturing methods therefor, in which the area devoted to electrical isolation between the MFET and SFET is reduced or minimized.

BRIEF DESCRIPTION OF THE DRAWINGS

The present invention will hereinafter be described in conjunction with the following drawing figures, wherein like numerals denote like elements, and wherein:

FIGS. 12-1 and 12-2 and FIGS. 13-1 and 13-2 are simplified flow charts of methods for fabricating the power MOSFET of FIGS. 2-11 incorporating the MFET and SFET, according to embodiments of the invention.

DETAILED DESCRIPTION OF THE INVENTION

Figure 1:
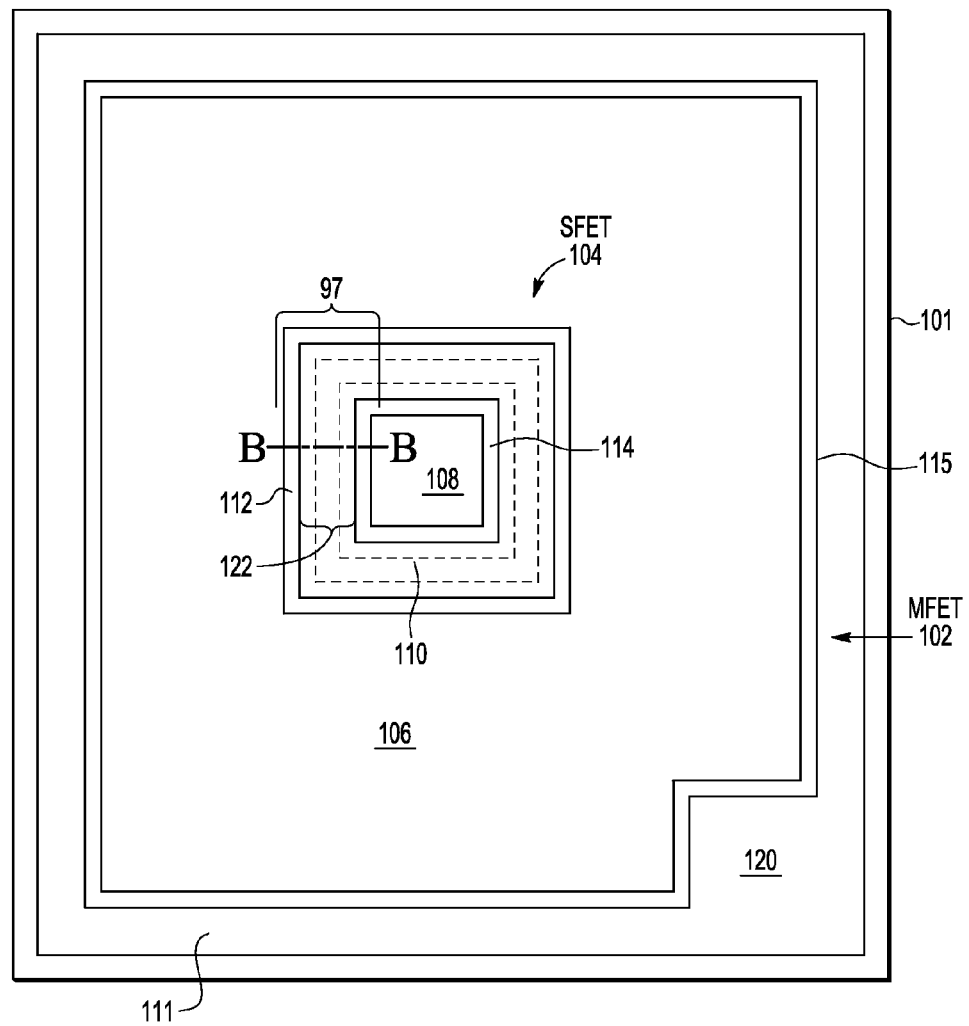
FIG. 1 shows a simplified plan view of a conventional power MOSFET incorporating an MFET and SFET.

The following detailed description is merely exemplary in nature and is not intended to limit the invention or the application and uses of the invention. Furthermore, there is no intention to be bound by any expressed or implied theory presented in the preceding technical field, background, or the following detailed description.

Although the abbreviation "MOS" and "MOSFET" and the terms for which they stand, literally refer to a FET having a metal gate electrode and an oxide gate insulator, the abbreviations MOS and MOSFET and the terms for which they stand are used throughout to refer to any semiconductor device that includes a conductive gate (whether metal or not) that is positioned over a gate insulator (whether oxide or other dielectric) which, in turn, is positioned over a semiconductor substrate. Accordingly, the term metal-oxide-semiconductor and the abbreviations "MOS" and "MOSFET" are used herein even though such devices may not employ just metals or oxides but conductive materials other than metals, and insulating materials other than oxides. Non-limiting examples of conductive materials suitable for use in MOS and MOSFETs are metals, metal alloys, semi-metals, metal-semiconductor alloys or compounds, doped semiconductors, combinations thereof. In particular, reference to "source metal", "overlying metal", "gate metal", and the like should be interpreted broadly to include the various forms of conductors discussed above and are not intended to be limited merely to metallic conductors. Non-limiting examples of insulating materials suitable for use in MOS and MOSFETs are oxides, nitrides, oxy-nitrides mixtures, organic insulating materials and other dielectrics.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements or regions in the figures may be exaggerated relative to other elements or regions to help improve understanding of embodiments of the invention.

The terms "first," "second," "third," "fourth" and the like in the description and the claims, if any, may be used for distinguishing between similar elements or steps and not necessarily for describing a particular sequential or chronological order. It is to be understood that the terms so used are interchangeable under appropriate circumstances such that the embodiments of the invention described herein are, for example, capable of operation or arrangement in sequences other than those illustrated or otherwise described herein. Furthermore, the terms "comprise," "include," "have" and any variations thereof, are intended to cover non-exclusive inclusions, such that a process, method, article, or apparatus that comprises a list of elements or steps is not necessarily limited to those elements or steps, but may include other elements or steps not expressly listed or inherent to such process, method, article, or apparatus. The term "coupled," as used herein, is defined as directly or indirectly connected in an electrical or non-electrical manner. As used herein the terms "substantial" and "substantially" mean sufficient to accomplish the stated purpose in a practical manner and that minor imperfections, if any, are not significant for the stated purpose.

As used herein, the term "semiconductor" and the abbreviation "SC" are intended to include any semiconductor whether single crystal, poly-crystalline or amorphous and to include type IV semiconductors, non-type IV semiconductors, compound semiconductors as well as organic and inorganic semiconductors. Further, the terms "substrate", "semiconductor substrate" and "SC substrate" are intended to include single crystal structures, polycrystalline structures, amorphous structures, thin film structures, and layered structures.

For convenience of explanation and not intended to be limiting, semiconductor devices and methods of fabrication are described herein for silicon semiconductors, but persons of skill in the art will understand that other semiconductor materials may also be used. Additionally, various device types and/or doped SC regions may be identified as being of N type or P type, but this is merely for convenience of description and not intended to be limiting, and such identification may be replaced by the more general description of being of a "first conductivity type" or a "second, opposite conductivity type", where the first conductivity type may be either N or P type and the second conductivity type is then either P or N type. Various embodiments of the invention will be illustrated for N-channel MOSFETs but, again, this is merely for convenience of description and is not intended to be limiting. Persons of skill in the art will understand that P-channel MOSFETs and other semiconductor devices and circuits embodying either or both N-channel and P-channel combinations may be provided by appropriate interchange of conductivity types in the various regions.

FIG. 1 shows a simplified plan view of power MOSFET 100 on common substrate 101 incorporating MFET 102 and embedded SFET 104, according to the prior art. Gate contact pad 120 is coupled to peripheral gate metal 111, which is used for distributing the gate signal to the various common gate regions within device 100. Gap 115 is provided between peripheral gate metal 111 and source metal 106 of MFET 102. SFET 104 has SFET source metal 108. The source regions of MFET 102 generally underlie its corresponding source metal 106 and the source regions of SFET 104 generally underlie its corresponding source metal 108. In plan view, SFET 104 and its underlying source regions are located approximately centrally within source metal 106 and the underlying source regions of MFET 102 to facilitate their having similar temperatures. Common gate metal 110 lies on the surface of MOSFET 100 between metal-to-metal gaps 112 and 114. Underlying common gate metal 110 is isolation region 122 comprising a combination of doped body rings and trench rings. Combination 97 of electrical isolation region 122 and metal-to-metal gaps 112 and 114 electrically isolates source metal 106 (and underlying sources) of MFET 102 from source metal 108 (and underlying sources) of SFET 104. The gates of power MOSFET 100 may run perpendicular to cross-section BB, and are generally in the form of multiple dielectric lined, conductor filled trenches. The source regions lie alongside such dielectric lined trenches. This is common in the art. A difficulty with the prior art configuration of power MOSFET 100 of FIG. 1 and those generally like it, is that isolation region 122 and the other elements lying between metal-to-metal gaps 112 and 114, occupy a significant area of power MOSFET 100. It is well known in the art that the cost of semiconductor devices, and especially power MOSFETs, increases as the overall device area increases. Accordingly, reducing the area needed to separate and isolate the MFET and embedded SFET is highly desirable.

Figure 2:
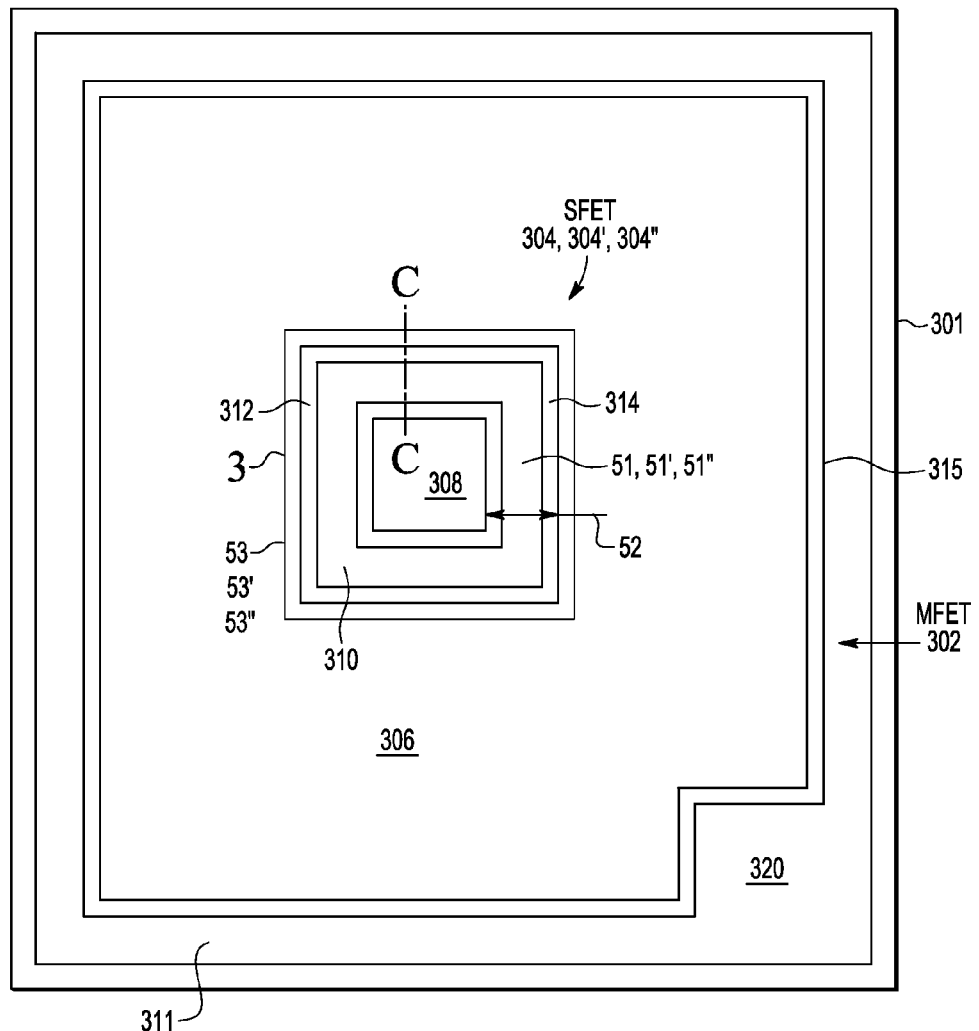
FIG. 2 shows a simplified plan view of a power MOSFET incorporating an MFET and SFET according to an embodiment of the invention.

FIG. 2 shows a simplified plan view of power MOSFET 300 on common substrate 301 incorporating MFET 302 and embedded SFET 304, 304', 304", according to the invention. For convenience of explanation, the overall layout of MOSFET 300 is shown as being generally similar with that of MOSFET 100 of FIG. 1, but with a different MFET 302 to SFET 304, 304', 304" isolation structures or gaps 51, 51', 51" shown in more detail in FIGS. 3-4 and 8-11. However, other general plan view layouts may also be used for power MOSFET 300 incorporating the isolation structures or gaps illustrated in FIGS. 3-11.

MFET 302 has source metal 306 and associated source regions (assumed by way of example and not limitation to be underlying source metal 306). SFET 304, 304', 304" has source metal 308 and associated source regions (assumed by way of example and not limitation to be underlying source metal 308). While the word "metal" is used for conductors 306 and 308, as explained above, the term "metal" is intended to include any type of conductor and not be limited merely to metallic elements.

Persons of skill in the art will understand that some portions of source metals 306, 308 or bonding pads coupled to source metals 306, 308 may not overlie their respective source regions to minimize source region bonding damage from external connections to the source metals. For convenience of explanation it is assumed herein that the MFET sources underlie MFET metal 306 and the SFET sources underlie SFET metal 108 without regard to the location of the source bonding pads or areas which are not specifically identified. Further, to avoid cluttering the drawing and potentially obscuring the invention, the respective source regions are not shown in FIG. 2 but are shown in cross-section in FIGS. 3-9 and elsewhere.

Gate contact pad 320 may be coupled to peripheral gate metal 311, which can be used for distributing the common gate signal to the various gate regions within MFET 302 and SFET 304, 304', 304", but other gate signal distribution arrangements may also be used. Gap 315 can be provided between peripheral gate metal 311 and source metal 306 of MFET 302, but this is not essential if other arrangements are used for distribution the common gate signal. In plan view, SFET 304, 304', 304" and its associated source regions are located approximately centrally within source metal 306 of MFET 302 and its associated source regions. In a preferred embodiment the gates of power MOSFET 300 generally run perpendicular to cross-section CC, and are generally in the form of multiple dielectric lined, conductor filled trenches, as illustrated for example in FIGS. 3-9 and elsewhere. The source regions of MFET 302 and SFET 304, 304', 304" lie alongside such dielectric lined trenches. Buffer zone or gap 51, 51', 51" of width 52 lies between MFET source metal 306 (and its associated source regions) and SFET source metal 308 (and its associated source regions). Gate metal 310 desirably overlies gap 51, 51', 51" 51 containing isolation gate runners 40-*i*, 40'-*i* and 40"-*i* of FIGS. 3-11. Gap 312 is provided between source metal 306 of MFET 302 and common gate conductor 310 overlying buffer zone or gap 51, 51', 51" and gap 314 is provided between common gate conductor 310 and source metal 308 of SFET 304, 304', 304". SFETs 304, 304', 403" illustrate various embodiments of the invention. Electrical isolation between MFET 302 and SFET 304, 304', 304" is provided within buffer zone or gap 51, 51', 51", as shown in more detail in connection with FIGS. 3-11.

Figure 3:
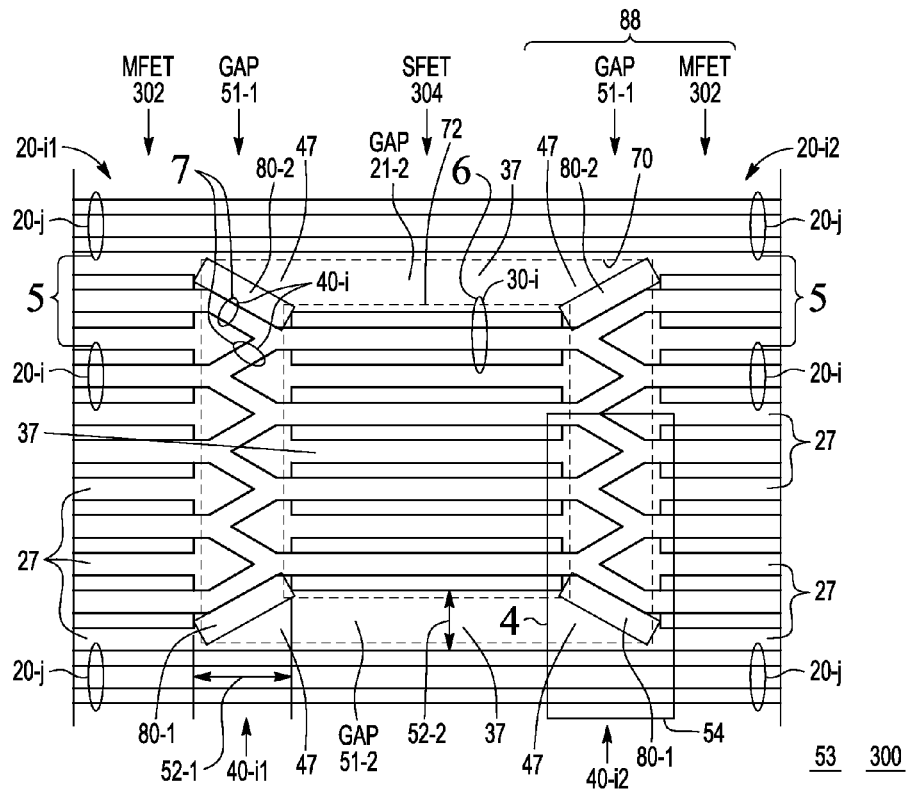
FIG. 3 shows an enlarged simplified plan view of the isolation portion of the power MOSFET of FIG. 2 between parts of the MFET and the SFET according to an embodiment of the invention and showing further detail.
Figure 4:
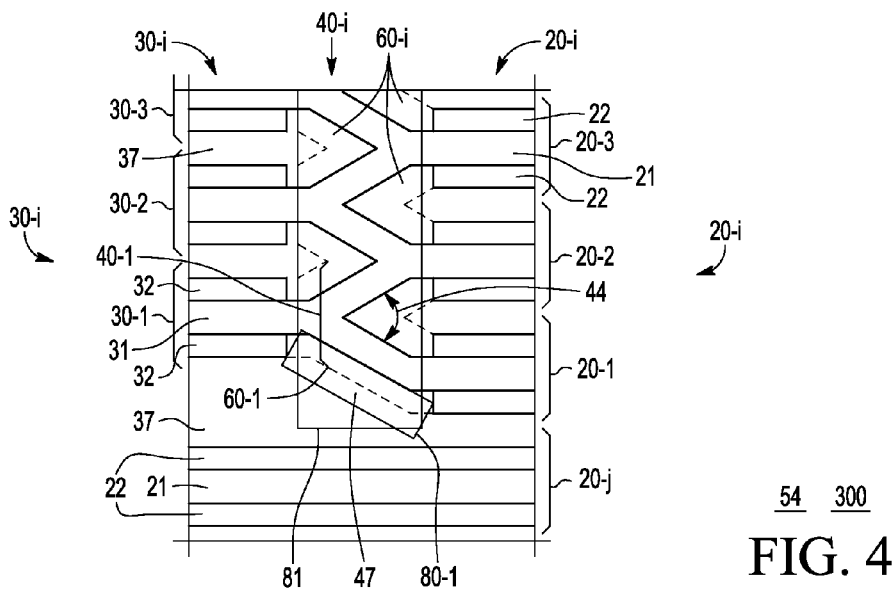
FIG. 4 shows a further enlarged view of a part of the isolation portion of the power MOSFET of FIG. 3 providing still further details according to an embodiment of the invention.
Figure 5:
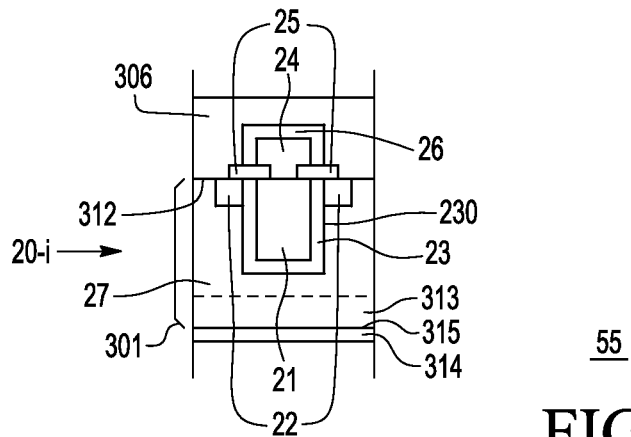
FIGS. 5-7 show simplified cross-sectional views through different parts of the power MOSFET of FIGS. 2-4 according to further embodiments of the invention.
Figure 6:
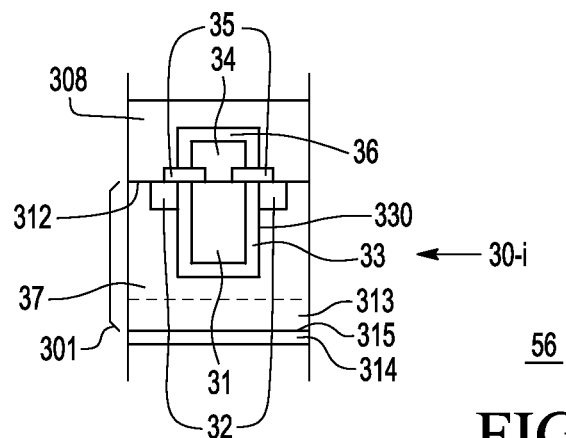
Figure 7:
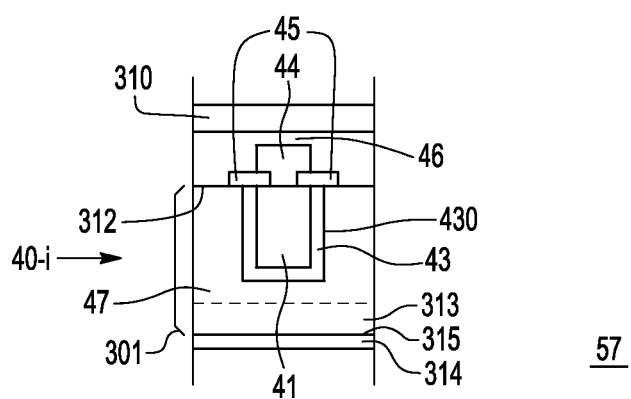

FIG. 3 shows an enlarged simplified plan view of portion 53 of power MOSFET 300 of FIG. 2 incorporating parts of MFET 302 and SFET 304, and buffer zone or gap 51 of width 52, according to a further embodiment of the invention. FIG. 4 shows a further enlarged view of part 54 of portion 53 of power MOSFET 300 of FIG. 3 providing further detail, according to a still further embodiment of the invention. FIGS. 5-7 show simplified cross-sectional views through different sub-parts 55, 56, 57 of power MOSFET 300 of FIG. 2-3; in the locations indicated in FIG. 3 by the numbers 5, 6, and 7. Sub-part 55 is shown in FIG. 5, sub-part 56 is shown in FIG. 6 and sub-part 57 is shown in FIG. 7.

Referring now to FIGS. 3-10, MFET 302 lies substantially outside of perimeter 70 and SFET 304, 304' lies substantially within smaller perimeter 72. Between perimeters 70, 72 of FIG. 3 lies buffer zone or gap 51 having portions 51-1 (e.g., left and right portions) and 51-2 (e.g., top and bottom portions). Gate runners 20-*i*, 30-*i*, and 40-*i* located in different parts of FIGS. 3-10 comprise conductor filled dielectric lined trenches 230, 330, 430 (e.g., see FIGS. 5-11) and for gate runners 20-*i*, 30-*i* include associated source regions 22, 32 adjacent to dielectric liners 23, 33 of trenches 230, 330. Gate runners 40-I, 40'-*i* have substantially no source regions. Gate runners 20-*i*, 40-*i*, 40'-*i* include left portions 20-11, 40-*i*1, 40'-*i*1 and right portions 20-*i*2, 40-*i*2, 40'-*i*2, respectively. The cross-sections of gate runners 20-*i*, 30-*i* and 40-*i* are shown in FIGS. 5-7, respectively. Dielectric liners 23, 33, 43 (e.g., the gate insulators) illustrated in FIGS. 5-7 in trenches 230, 230, 430 are omitted in FIGS. 3-4 and 8-11 to avoid cluttering the drawings. A prime (') is added to the gate runners associated with MOSFET and SFET embodiments 300', 304' of FIG. 8 and a double prime (") is added to gate runners associated with MOSFET and SFET embodiments 300", 304" of FIG. 11. As will be understood by those of skill in the art, some features in the various FIGS. apply to several embodiments of the invention.

Gate runners 20-*i* are located in MFET 302 substantially outside of perimeter 70 and are shown in cross-section in FIG. 5. Gate runners 30-*i* are located in SFET 304 substantially within perimeter 72 and are shown in cross-section in FIG. 6. Gate runners 40-*i* are located in buffer zone or gap 51 and are shown in cross-section in FIG. 7. For simplicity, all of gate runners 20-*i*, 30-*i* and 40-*i* are shown as having substantially the same lateral dimensions, but this is not essential. Gate runners 20-*i* have conductive gate cores 21 laterally enclosed by dielectric liners 23 and with associated source region 22. Gate runners 30-*i* have conductive gate cores 31 laterally enclosed by dielectric liners 33 and with associated source regions 32. Gate runners 40-*i* have conductive gate cores 41 laterally enclosed by dielectric liners 43 but substantially no source regions.

Referring to FIGS. 3-7 and especially to FIGS. 5-7, source regions 22 (e.g., N+) of gate runners 20-*i* lie laterally outside of dielectric liners 23 proximate upper surface 312 of substrate 301 in (e.g., P type) MOSFET body regions 27 and generally may underlie source metal 306 of MFET 302. Source regions 32 (e.g., N+) of gate runners 30-*i* lie laterally outside of dielectric liners 33 proximate the surface of substrate 301 in (e.g., P type) MOSFET body region 37, generally underlying source metal 308 of SFET 304. o source regions are provided for gate runners 40-*i*. It is common to provide source regions 22, 32 on both sides of conductive gate cores 21, 31 and separated from gate core 21, 31 by gate dielectrics 23, 33, but in other embodiments, some or all of gate cores 21, 31 may have only one adjacent source region 22, 32 and separated therefrom by dielectric liner 23, 33. Substantially no source regions are provided for gate runners 40-*i*.

Referring again to FIGS. 5-7, insulating regions 25, 35 are provided proximate to substrate surface 312 to allow separate electrical contacts to be made to conductive gate cores 21, 31, and to (e.g., N+) sources 22, 32 and optionally also to (e.g., P type) body regions 27, 37. Conductive gate connections 24, 34 may be provided to gate cores 21, 31, but this is not essential for every gate runner 20-*i*, 30-*i* since gate cores 21, 31 are themselves conductive and may be coupled to gate pad 320 without overlying conductive gate connection 24, 34 everywhere, although that is not precluded. Gate connections 24, 34 make Ohmic contact with conductive gate cores 21, 31. When gate connections 24, 34 are present, insulator 26, 36 is provided over gate connections 24, 34. When gate connections 24, 34 are omitted in, for example, some of gate runners 20-*i*, 30-*i*, then insulator 25, 35 may extend over conductive gate cores 21, 31. Either arrangement is useful. Above insulator 26 (if used) and some or all of insulator 25 and electrically isolated from conductive gate cores 21, is source metal 306 of MFET 302. Source metal 306 contacts sources 22 (and in many applications also body region 27) and substantially couples some or all of source regions 22 of MFET 302 in parallel. Above insulator 36 (if used) and some or all of insulator 35 and electrically isolated from gate cores 31, is source metal 308 of SFET 304. Source metal 308 contacts sources 32 (and in many applications also body region 37) and substantially couples some or all of source regions of SFET 304 in parallel. Elements 31, 32, 33, 34, 35, 36 and 37 of FIG. 6 are analogous to elements 21, 22, 23, 24, 25, 26 and 27 of FIG. 5, and may, for convenience, have similar cross-sections and compositions and be formed at the same time, but that is not essential.

Referring to FIGS. 3-10, gate runners 40-*i* are located between SFET 304 and MFET 302 within buffer zone or gap 51 substantially between perimeters 70, 72. Gate runners 40-*i* are shown in cross-section in FIG. 7. For convenience of explanation and not intended to be limiting, all of gate runners 40-*i* are assumed to have substantially the same lateral dimensions, but that is not essential. Gate runners 40-*i* have conductive gate cores 41 laterally enclosed by dielectric liners 43, extending to upper surface 312 of substrate 301. Insulating regions 45 are provided when gate connection 44 is used, but are not essential when gate connections 44 do not overlap in contact with body region 47. Conductive gate connections 44 may be provided to gate cores 41, but this is not essential for gate runners 40-*i* since gate cores 41 are themselves conductive and may be coupled to gate pad 320 without conductive gate connections 44. Gate connections 44 makes Ohmic contact with conductive gate cores 41 and, when gate connections 44 are present, insulator 46 is provided over gate connections 44. When gate connections 44 are omitted in some gate runners 40-*i*, then insulator 45 may extend over conductive gate core 41. Either arrangement is useful. Since there are substantially no source regions with gate runners 40-*i*, source metal does not extend over gate runners 40-*i* in buffer zone or gap 51. However, as illustrated in FIG. 7, common conductor 310 may be provided over insulating layer 45, and/or 46 of gate runners 40-*i*. Common conductor 310 is ordinarily electrically coupled to gate pad 320, but this is not essential. Elements 41, 43, 44, 45, 46 and 47 of FIG. 6 are analogous to elements 21, 23, 24, 25, 26 and 27 of FIG. 5, and may, for convenience, have similar cross-sections and composition, and be formed at the same time and/or have different plan view shapes, but that is not essential. For example, body regions 27, 37, 47 may all be formed at the same time, e.g., as part of a common epi-region or common substrate 301 and therefore have substantially the same doping. Gate runners 40'-*i* of FIG. 8 perform substantially the same function as gate runners 40-*i* of FIGS. 3-4 and conveniently have a substantially similar cross-section as shown in FIG. 7.

Figure 8:
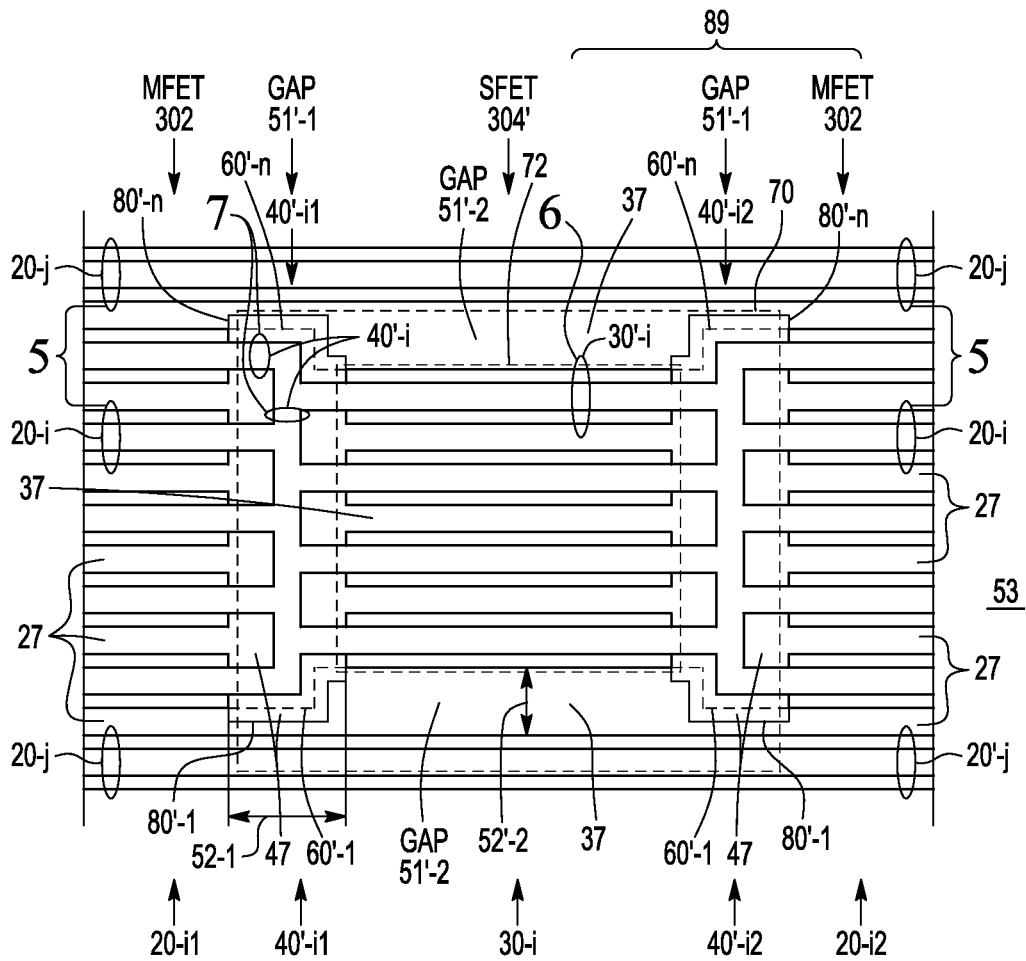
FIG. 8 shows an enlarged simplified plan view of the isolation portion of the power MOSFET of FIG. 2 incorporating the SFET and part of the MFET according to another embodiment of the invention.
Figure 9:
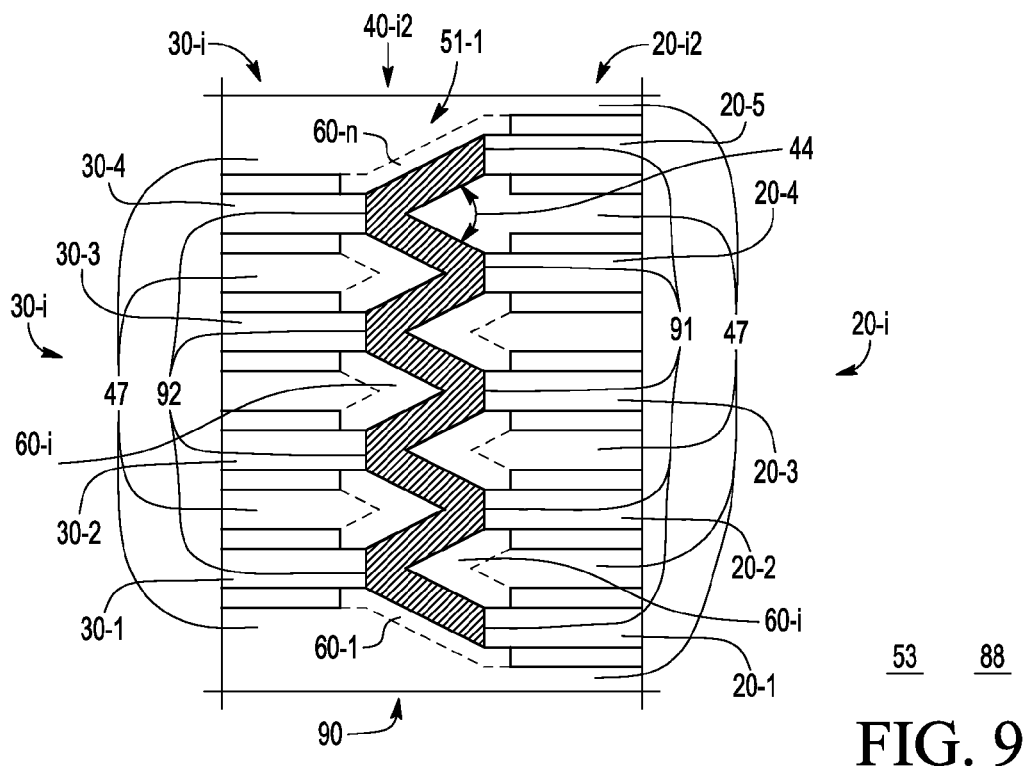
FIGS. 9 and 10 show an enlarged simplified plan view part of the isolation portions of the power MOSFET of FIGS. 2-8 incorporating the MFET and SFET and providing further details according to an embodiment of the invention.
Figure 10:
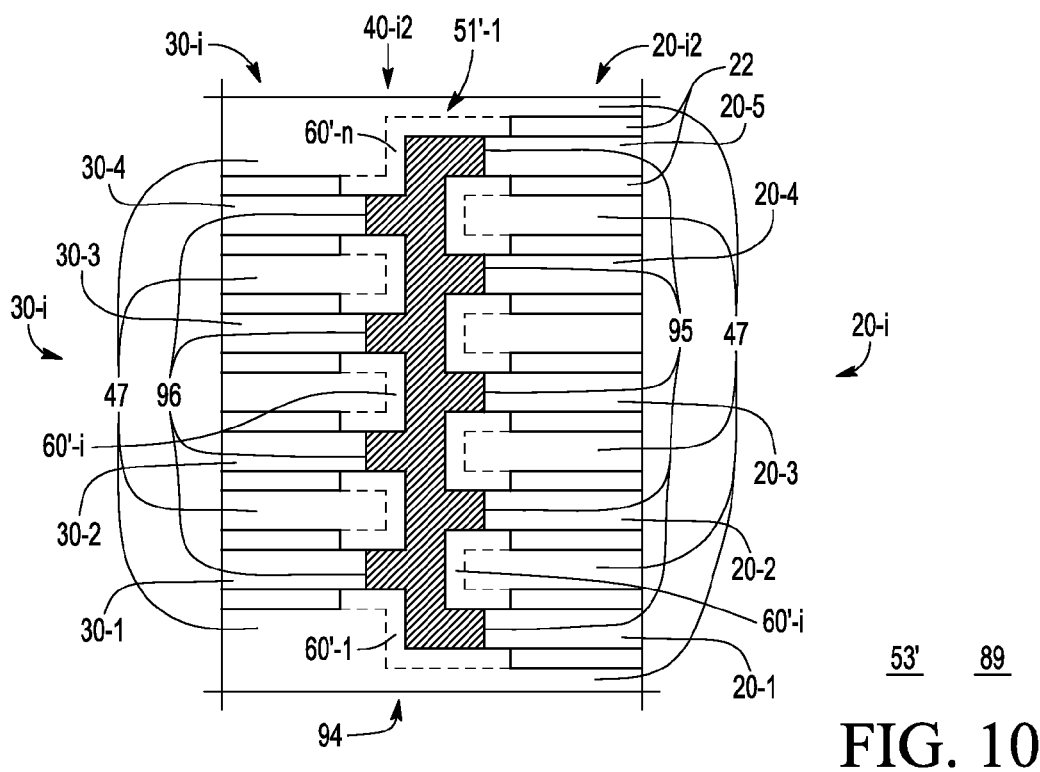

FIGS. 3-4 and 9 illustrate a wishbone or Y-like configuration in plan view for gate runners 40-*i* and FIGS. 8 and 10 illustrate a staggered T-like configuration in plan view for gate runners 40'-*i*. Stated another way, gate runners 40'-*i* of FIGS. 3-4, have a saw-tooth shaped plan view where the peaks and valleys of the saw teeth are connected to one or the other of gate cores 21 or 31. An equivalent arrangement is illustrated in FIGS. 8-9 where gate runners 40'-*i* have a staggered T-like like plan view, where the flat topped portions of the peaks and valleys are coupled to one or the other of gate cores 21 or 31. Except for gate runners 40-1, 40'-1 and 40-*n*, 40'-*n* (where n=total number of gate runners 40-*i*), two adjacent gate conductors 20-*i* and 20-(*i*+1) of MFET 302 are coupled to one gate conductor 30-*i* of SFET 304, 304' and vice versa. For convenience of description, the plan view shapes of gate runners 40-*i*. 40'-*i* illustrated in FIGS. 3-4 and 8-10 are referred to as having a zigzagged plan view configuration. This is discussed in more detail in connection with FIGS. 9-10 and elsewhere.

Referring now to regions 53 of MOSFET 300 shown in FIGS. 3 and 4, and region 53' of MOSFET 300' of FIG. 8, by way of example and not limitation, various gate runners 20-1, 20-2, 20-3, for example, are identified in MFET 302 and various gate runners 30-1, 30-2 are identified in SFET 304. It will be noted that adjacent gate runners, for example gate runners 20-1 and 20-2 of MFET 302 of FIG. 4, are coupled in buffer zone or gap 51, 51', e.g., via gate runner 40-1, 40'-1, to gate runner 30-1 in SFET 304. Similarly, adjacent gate runners 20-2, 20-3 are connected to gate runner 30-2. This same arrangement is followed for all of the gate runners 20-*i* and 30-*i* in MFET 302 and SFET 304 of FIGS. 3-4 and 8-10 that are coupled by gate runners 40-*i* and 40'-*i*. Stated another way, adjacent MFET gate runners 20-*i*, 20-(*i*+1) are coupled to SFET gate runner 30-*i*. This has the effect of tying all of gate runners 20-*i* together and to all of gate runners 30-*i* that are similarly tied together. The same arrangement is used in region 53 of FIGS. 3-4 and 9 and in region 53' of FIGS. 8 and 10. Such coupling is provided by gate runners 40-*i* in buffer zone or gap 51-1 in FIGS. 3-4 and 9 and by gate runners 40'-*i* in buffer zone or gap 51'-*i* in FIGS. 8 and 10.

FIGS. 9 and 10 show enlarged simplified plan views 88, 89 of isolation gate runners 40-*i*, 40'-*i* in gap or buffer region 51, 51' of power MOSFET 300, 300' of FIG. 2 incorporating SFET 304, 304' according to still other embodiments of the invention. In FIGS. 9-10 central parts 90, 94 of isolation gate runners 40-*i*. 40'-*i* are hatched to make then more visible. With the wishbone or Y-like configuration of FIGS. 3-4 and 9, angle 44 between the arms of the wishbone or Y is usefully in the range of about 50 to 150 degrees, with about 90 to 130 degrees being preferred. The arrangement of isolation gate runners 40'-*i* of FIGS. 8 and 10 is referred to as having staggered T-like configuration, but it will be understood that such connections may also be considered electrically to be equivalent to a Y connection where each arm of the Y in FIGS. 8 and 10 has an L-shaped configuration. Either of the arrangements of FIGS. 3-4 and 8-10 is useful. However, in other embodiments, other configurations of isolation gate runners 40-*i*, 40'-*i* may be used, as for example and not intended to be limiting, having the Y shaped arms of central portion 90 of isolation gate runners 40-*i* or having the rectilinear or staggered T-like arrangement of central portion 94 of isolation gate runners 40'-*i* of FIG. 10 where such arms may be curved rather than straight or L shaped. As illustrated in FIGS. 3-4, and 8-10, all gate runners 20-*i* are desirably tied together, all gate runners 30-*i* are desirably tied together and the two groups of gate runners are coupled to via isolation gate runners 40-*i*, 40'-*i*.

Another way of describing the coupling through isolation gate runners 40-*i* between MFET gate runners 20-*i* and SFET gate runners 30-*i* is to note in connection with the arrangement of FIGS. 3-4 and 9, that saw-tooth or zigzag shaped central or cross-coupling region 90 of isolation gate runners 40-*i* of FIG. 9 has connections 91 (hereafter the "zigs") contacting MFET gate runners 20-*i* on one side of zigzagged central or cross-coupling region 90 and connections 92 (hereafter the "zags") contacting SFET gate runners (30-*i*) on the opposite side of zigzagged central or cross-coupling region 90 of FIG. 9, and that all zigs 91 are coupled to all zags 92; hence the term "cross-coupling) used to describe the function of central region 90. Similarly, coupling through isolation gate runners 40'-*i* between MFET gate runners 20-*i* and SFET gate runners 30-*i* in connection with the arrangement of FIGS. 8 and 10, that staggered T-like or zigzagged central or cross-coupling region 94 of isolation gate runners 40'-*i* of FIG. 10 has connections 95 (hereafter the "zigs") contacting MFET gate runners 20-*i* on one side of staggered T-like or zigzagged central region 94 and connections 96 (hereafter the "zags") contacting SFET gate runners 30-*i* on the opposite side of staggered T-like or zigzagged central region 94 of FIG. 10, and that all zigs 95 are coupled to all zags 96, thereby providing the cross-coupling. The terms "zig", "zag", "zigzag" and "zigzagged" are used in connection with central cross-coupling regions 90, 94 since they refer to the same connection points and electrical coupling irrespective of the exact shape of central cross-coupling regions 90, 94.

It has been found that this three terminal configuration of isolation gate runners 40-*i*, 40'-*i* substantially reduces the parasitic leakage between source regions 22 of MFET 302 and source regions 32 of SFET 304. In the prior art, it has been common to have source-less gate runners go straight through from MFET gate runners 20-*i* to SFET gate runners 30-*i*. With this configuration, leakage can arise between MFET 302 and SFET 304. If the portions of the (e.g., P-type) body region adjacent such prior art connecting gate runners become inverted (e.g., become N type), this can provide a substantially Ohmic conduction path between (e.g., N+) source regions 22 of gate runners 20-*i* of MFET 302 and (e.g., N+)

source regions 32 of gate runners 30-*i* of SFET 304. If this happens, the CSR of SFET 304 may change during operation, for example, due to variations of such parasitic effects, variations in source voltages of MFET 302 and SFET 304, and/or from device aging. SFET 304 may also be more temperature sensitive. Such behavior is not desirable.

Referring now to FIGS. 3-4 and 8 and particularly FIGS. 9-10, the zigzagged structure of isolation gate runners 40-*i*, 40'-*i* in buffer zone or gap 51-1, 51-2 of FIGS. 3-4 and 9 and buffer zone or gaps 51'-1, 51'-2 of FIGS. 8 and 10 greatly reduces or substantially eliminates such parasitic behavior. For all gate runners 20-*i*, 30-*i* (i=1 to n) except first gate runners 20-1, 30-1 and last gate runners 20-(*n*+1), 30-*n* (where n is the total number of isolation gate runners in the SFET), the parasitic leakage paths 60-*i*, 60'-*i* (where i≠1, i≠n) are blocked by the intervening arms of the dielectric lined trenches of isolation gate runners 40-*i*, 40'-*i* (for i≠1, i≠n) making up the zigzagged connection between gate runners 20-*i* and 30-*i*. Except for the first and last gate runners (i=1, i=n), the zigzag central portions 90, 94 of isolation gate runners 40-*i*, 40'-*i* in FIGS. 9-10 act as isolation walls, preventing a parasitic inversion of the local (e.g., P type) body region 47, 47' where such zigzagged isolation gate runners intervene between source regions 22 and 32. With the arrangement of FIGS. 3-4 and 8-10 this situation occurs in all except the outer or outboard legs of first and last isolation gate runners 40-1, 40-*n* and 40'-1, 40'-*n*. This geometric arrangement can be seen more clearly in FIG. 9 for isolation gate runners 40-*i*, and in FIG. 10 for isolation gate runners 40'-*i*. Since it is generally desired to have gate runners 20-*i* of MFET 302 connect to gate runners 30-*i* of SFET 304, the structures illustrated in FIGS. 3-10 accomplish both tasks. That is, the zigzagged arrangements described above for gate runners 40-*i*, 40'-*i*, couple gate runners 20-*i*1 of a first part of MFET 302 to gate runners 30-*i* of SFET 304 and thence to gate runners 20-*i*2 of a second part of MFET 302, while at the same time providing inherent isolations walls in gate runners 40-*i*, 40'-*i* (i≠1, i≠n) to reduce or substantially eliminate significant parasitic conduction between source regions 22 of gate runners 20-*i* of MFET 302 and source regions 32 of gate runners 30-*i* of SFET 304. This is highly desirable.

As can be seen in FIGS. 4, 8 and 9-10 the first gate runners 20-1, 30-1 and the last gate runners 20-(*n*+1), 30-*n* (where n=total number of gate runners in SFET 304) are asymmetric. The lower side of first gate runners 20-1, 30-1 and the upper side of last gate runners 20-(*n*+1), 30-*n* have no blocking branch or arm between the outboard sources of gate runners 20-1, 30-1 and between the outboard sources of 20-(*n*+1), 30-*n*. Thus, potential leakage paths 60-1, 60'-1 and 60-*n*, 60'-*n* remain. However the potential adverse effect of source-to-source leakage is reduced in direct proportion to the number n of gate runners being used in SFET 304. For example, if there are n gate runners in SFET 304 coupled straight through to n gate runners in MFET 302 without the zigzagged arrangements described herein, there are potentially 2*n* source-to-source leakage paths. With the arrangement illustrated in FIGS. 3-4 and 8-10, where n gate runners 30-1 to 30-*n* in SFET 304 are coupled to (n+1) gate runners 20-1 to 20-(*n*+1) in MFET 302, there are only two potential source-to-source leakage paths. All except one side of the first and last coupling gate runners 40-*i* (i=1 and n) are blocked by the arms of the zigzagged configurations, whether angled as in FIGS. 3-4 and 9 or rectilinear as in FIGS. 8 and 10. Accordingly, the reduction in leakage paths with the arrangement of FIGS. 2-10 is substantially directly given by the ratio 2/2n=1/n. Since it is common to have a significant number n of individual gate runners 30-*i* (i=1 to n) in SFET 304, this reduction can be very significant. For example, and not intended to be limiting, for n=4 gate runners in SFET 304 as shown in FIGS. 3 and 8-10, the leakage is reduced to 25% of its value compared to the prior art straight through arrangement. If n=10, the reduction is 90% and the reduction continues to increase in direct proportion to the number of gate runners used in SFET 304. This geometrically derived improvement can be very significant.

It is found that even limited residual leakage paths 60-1, 60-*n* and 60'-1, 60'-*n* discussed above can be greatly reduced or substantially eliminated by increasing the doping in regions 80-1, 80-*n* (collectively 80) of FIGS. 3-4 and 9 and 80'-1, 80'-*n* (collectively 80') of FIGS. 8 and 10 that encompass leakage paths 60-1, 60-*n* and 60'-1, 60'-*n* in body region 47 adjacent the outboard gate runners 40-1, 40-*n* and 40'-1 and 40'-*n*. Increasing the doping in potential leakage paths 60-1, 60-*n* and 60'-1, 60'-*n* of outboard body regions 47 has the effect of increasing the apparent threshold voltage for the onset of significant conduction through leakage paths 60-1, 60-*n* and 60'-1, 60'-*n*. Even a small increase in the apparent threshold voltage can provide significant reductions in leakage current along paths 60-1, 60-*n* and 60'-1 and 60'-*n*. For example and not intended to be limiting, for doping of (e.g., P-type) body region 47 in the range of about of about 2E18 to 5E18 per cm$^3$, locally increasing the (e.g., p-type) doping in region 80, 80' by a factor of about 20 to 50, can raise the parasitic threshold voltage by about 15 volts, resulting in about a factor of 100 reduction in the leakage current through potential leakage paths 60-1, 60-*n* and 60'-1, 60'-*n* This is desirable.

Figure 11:
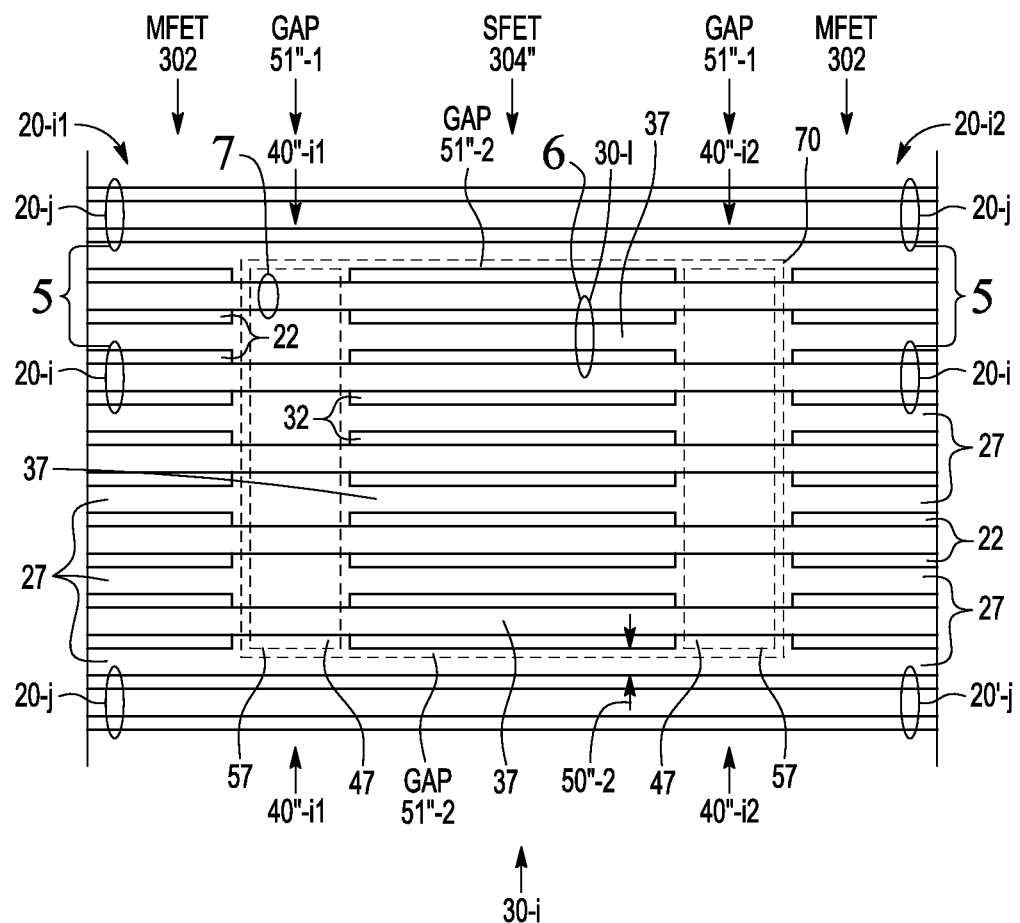
FIG. 11 shows an enlarged simplified plan view of the isolation portion of the power MOSFET of FIG. 2 incorporating the MFET and the SFET according to an embodiment of the invention.

FIG. 11 shows an enlarged simplified plan view of portion 53" of power MOSFET 300 of FIG. 2 incorporating SFET 304", according to yet another embodiment of the invention. Gate runners 20-*i* and 30-*i* have substantially the same configurations as has already been described. Structure 53" of FIG. 11 differs from structures 53 and 53' of FIGS. 3-4 and 8-10 in that isolation gate runners 40"-*i* are straight through and do not provide the coupling and blocking effects associated with zigzagged gate runners 40-*i* and 40'-*i* of FIGS. 3-4 and 8-10. In FIG. 11, gate runners 20-*i*, 30-*i* and 40"-*i* are all straight through paths. Gate runners 20-*i*, 30-*i* have cross-sections as in FIGS. 5-6 including source regions 22, 32 while gate runners 40"-*i* have a cross section as in FIG. 7 substantially without source regions. In other respects the arrangement and features of the various regions or elements identified are substantially similar to those already described and having the same reference numbers as in FIGS. 2-10, and such information is incorporated herein by reference. As has already been discussed, with a straight-through arrangement of n gate runners, there are 2n potential leakage paths. The source-to-source leakage can be reduced by raising the doping level of the part of body region 47 in gap regions 51"-1 and optionally also in gap regions 51"-2 illustrated in FIG. 11. Usefully, enhanced (e.g., P-type) doping is provided in region 57 within gaps 51"-1. In other embodiments, such increased doping can also extend over gap 51"-2 as well. Either arrangement is useful. For example and not intended to be limiting, for doping of (e.g., P-type) body region 47 in the range of about of about 2E18 to 5E18 per cm$^3$, locally increasing the (e.g., p-type) doping in regions 57 in gap 51"-1 and optionally also including gap region 51"-2 by a factor of about \20 to 50, can raise the parasitic threshold voltage by about 15 volts, resulting in about a factor of 100 reduction in the leakage current through the 2n potential leakage paths that exist in FIG. 11. This is desirable.

Figures 1, 12:
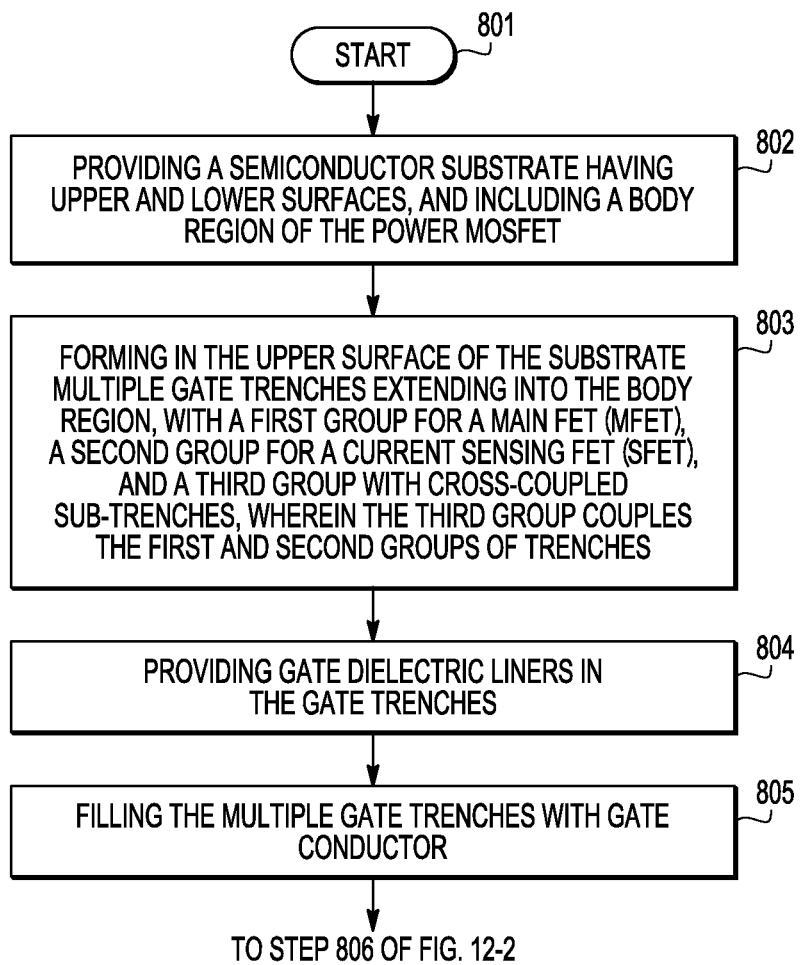
Figures 2, 12:
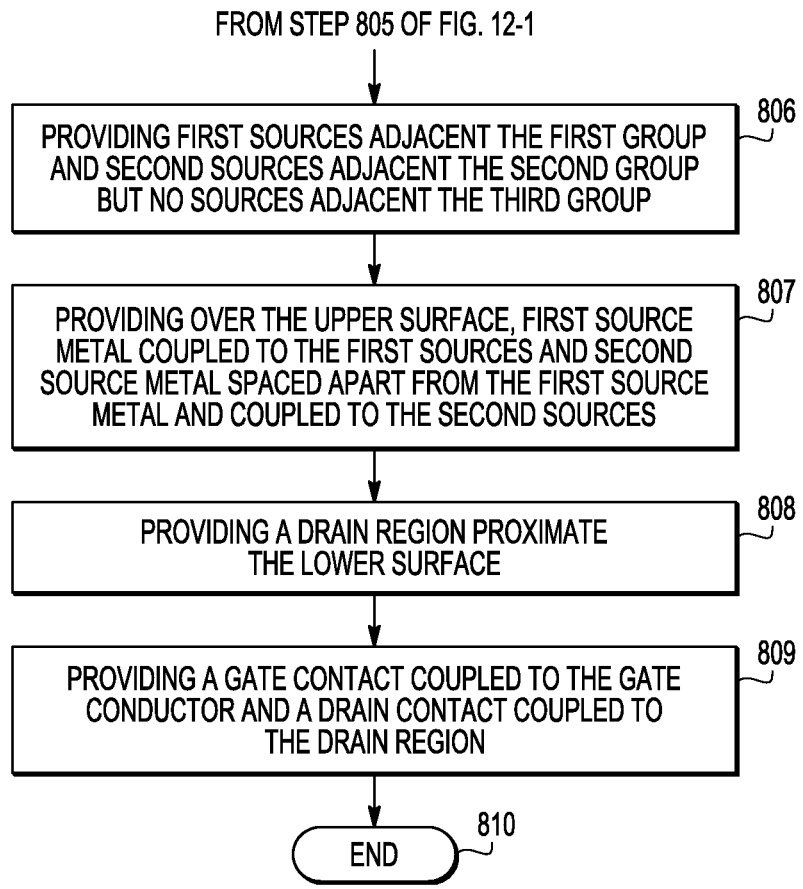

FIGS. 12-1 and 12-2 are simplified block diagram flow charts of method 800 for fabricating power MOSFET 300, 300' of FIGS. 2-10 incorporating MFET 302 and SFET 304. 304', according to still yet further embodiments of the invention. Method 800 begins with START 801 and initial step 802, in which there is provided a substrate (301) (e.g., see FIGS. 5-7) having upper (312) and lower (315) surfaces, including therein a body region (27, 37, 47) of the power MOSFET (300, 300'). In step 803, there is formed in the upper surface (312) of the substrate (301) multiple gate trenches (230, 330, 430) extending into the body region (27, 37, 47), and having a first group (220) for a main field effect transistor (MFET) (302), a second group (330) for a SFET (304) and a third group (430) with cross-coupled sub-trenches (90, 94), wherein the third group (430) couples the first (220) and second (330) groups of trenches. In step 804 there are provided dielectric liners (23, 33, 43) in the gate trenches (230, 330, 430). In step 805 the multiple gate trenches (230, 330, 430) are filled with gate conductor (21, 31, 41). In step 806, there is provided first sources (22) adjacent the first group (230) and second sources (32) adjacent the second group (330) but substantially no sources adjacent the third group (430). In step 807, there is provided, over the upper surface (312), first source metal (306) coupled to the first sources (22) and second source metal (308) spaced apart from the first source metal (306) and coupled to the second sources (32). In step 808 there is provided a drain region (313) proximate the lower surface (315). In step 809, there is provided a gate contact (320) coupled to the gate conductor (21, 31, 41) and a drain contract (314) coupled to the drain region (313). Method 800 then proceeds to END 810. The foregoing may be performed in other orders beside that listed and the order of the foregoing steps and the sequence of reference numbers is not intended to require that this specific order be followed. In a further embodiment, regions 80-1 and 80-n (see FIG. 9 and regions 80'-1 and 80'-n (see FIGS. 9-10 may have the doping locally increased to exceed the background doping of the body region (27, 37, 47) by a factor of about 20 or more.

Figures 1, 13:
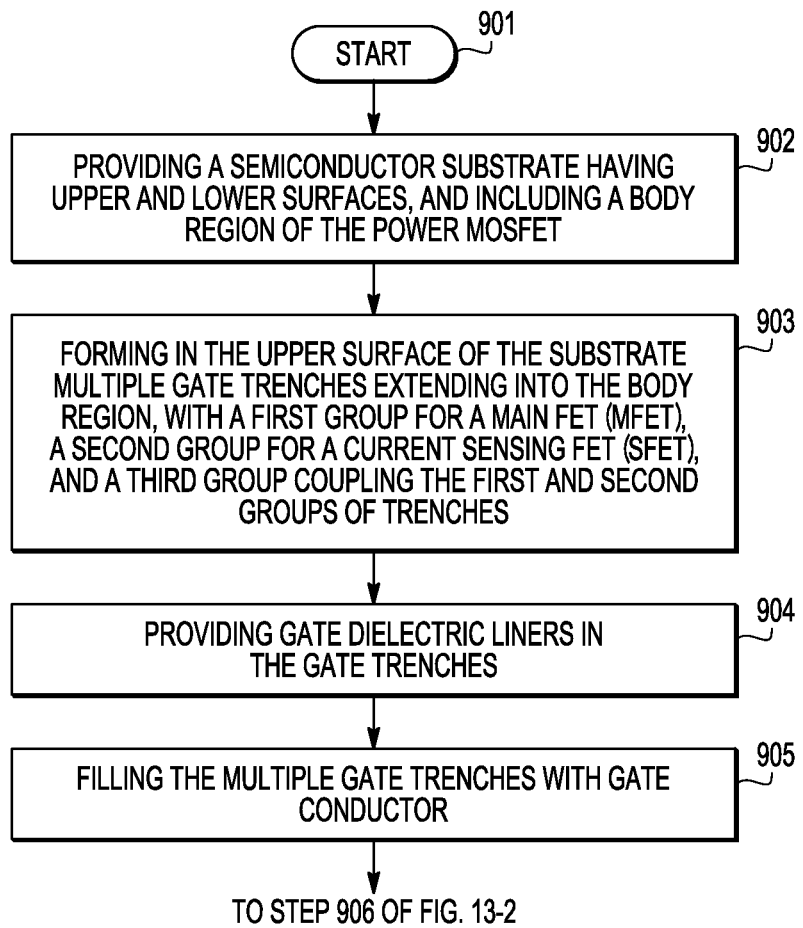
Figures 2, 13:
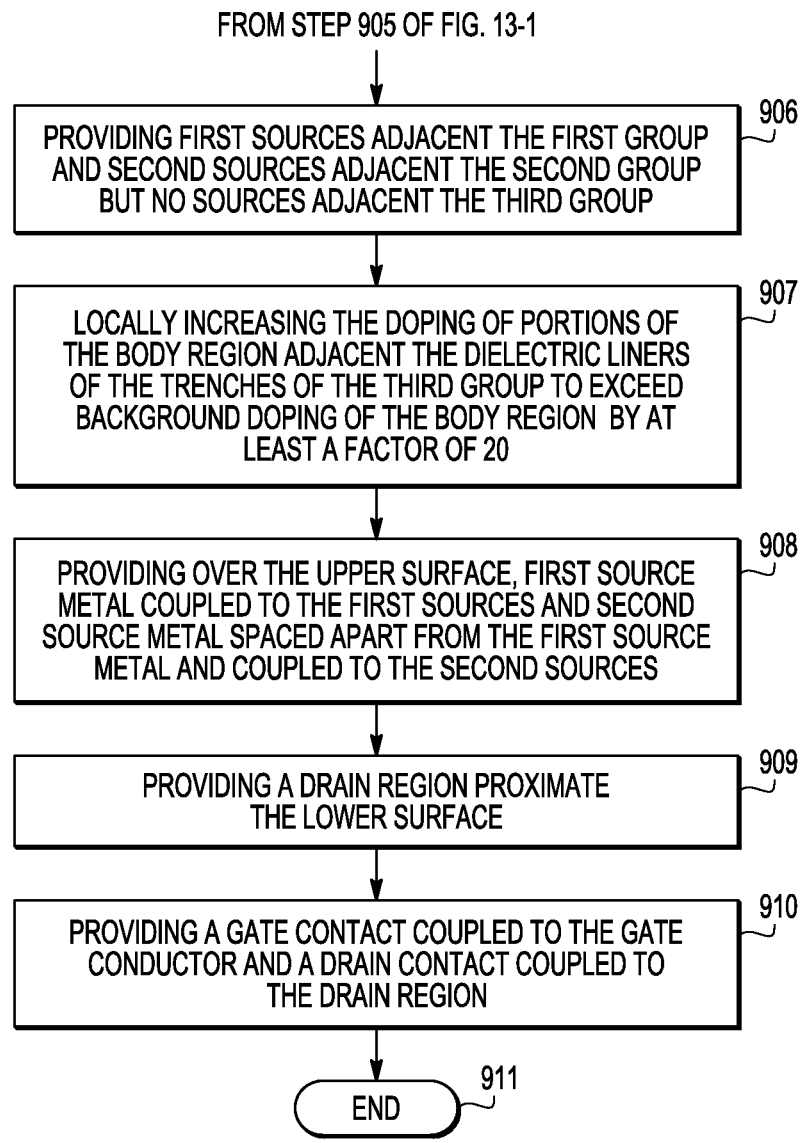

FIGS. 13-1 and 13-2 are simplified block diagram flow charts of method 900 for fabricating power MOSFET 300" of FIG. 11 incorporating MFET 302 and SFET 304" according to still yet another embodiment of the invention. Method 900 begins with START 901 and initial step 902, in which there is provided a substrate (301) having upper (312) and lower (315) surfaces, including therein a body region (27, 37, 47) of the power MOSFET (300"). In step 903, there is formed in the upper surface (312) of the substrate (301) multiple gate trenches (230, 330, 430) extending into the body region (27, 37, 47), and having a first group (230) for a main field effect transistor (MFET) (302), a second group (330) for a SFET (304") and a third group (430) coupling the first (230) and second (330) groups of trenches. In step 904 there are provided dielectric liners (23, 33, 43) in the gate trenches (230, 330, 430). In step 905 the multiple gate trenches (230, 330, 430) are filled with gate conductor (21, 31, 41). In step 906, there is provided first sources (22) adjacent the first group (230) and second sources (32) adjacent the second group (330) but substantially no sources adjacent the third group (430). In step 907, the doping is locally increased in the portions (57) of the body regions (27, 37, 57 adjacent the dielectric liners (43) of the third group (40"i) to exceed the background doping of the body region (27, 37, 47) by a factor of about 20 or more. In step 908 there is provided, over the upper surface (312), first source metal (306) coupled to the first sources (22) and second source metal (308) spaced apart from the first source metal (306) and coupled to the second sources (32). In step 909 there is provided a drain region (313) proximate the lower surface (315). In step 910, there is provided a gate pad (320) coupled to the gate conductor (21, 31, 41) and a drain contract (314) coupled to the drain region (313). Method 900 than proceeds to END 911. The foregoing may be performed in other orders beside that listed and the order of the foregoing steps and the sequence of reference numbers is not intended to require that this specific order be followed.

According to a first embodiment, there is provided a power metal-oxide-semiconductor-field-effect-transistor (MOSFET) (300, 300', 300"), comprising, a substrate (301) having upper (312) and lower (315) surfaces, a main field effect transistor (MFET) (302) formed in the substrate, having multiple MFET source regions (22) and MFET gate runners (20-i) extending to the upper surface (312), overlying source metal (306) coupled to the multiple MFET source regions (22), and a drain region (313) and drain contact (314) proximate the lower surface (315), a current sensing field effect transistor (SFET) (304) formed in the substrate (301), having multiple SFET source regions (32) and SFET gate runners (30-i) extending to the upper surface (312), overlying source metal (308) coupled to the multiple SFET source regions (32) and a drain region (313) and drain contact (314) proximate the lower surface (315), wherein the SFET (304) is laterally embedded within the MFET (302) but separated from the MFET (302) by a buffer region (51, 51', 51"), and isolating gate runners (40-i) substantially without source regions thereon, located in the buffer region (51, 51', 51") and electrically coupling the MFET gate runners (20-i) to the SFET gate runners (30-i) while electrically separating the MFET source regions (22) and the SFET source regions (32). According to a further embodiment, the isolating gate runners (40-i, 40'-1)) couple the SFET gate runners (30-1) together and couple the MFET gate runners (20-i) together, and further connect the coupled MFET gate runners (20-i) and the coupled SFET gate runners (30-i) to each other. According to a still further embodiment, the isolating gate runners (40-i, 40'-1) have a zigzag like plan view layout configuration (90, 94), with the SFET gate runners (30-i) coupled to the zigs (92, 96) and MFET gate runners (20-i) coupled to the zags (91, 95) of the isolating gate runners (40-i, 40"-i) According to a still yet further embodiment, the zigzag like plan view layout configuration (90, 94) of the isolating gate runners (40-i) have a saw-tooth like plan view layout configuration (90). According to a yet still further embodiment, the zigzag like plan view layout configuration (90, 94) of the isolating gate runners (40'-i) have a staggered T-like plan view layout configuration (94). According to another embodiment, there are n SFET gate runners (30-i) and n+1 MFET gate runners (20-i) interconnected by the isolating gate runners (40-i, 40'-i). According to a still another embodiment, n SFET gate runners (30-i) are coupled to n+1 MFET gate runners (20-i). According to a yet another embodiment, a first set of isolation gate runners (40-i1, 40'-i1) couple a first set of n+1 MFET gate runners (20-i1) to first terminals of a set of n SFET gate runners (30-i) and a second set of isolation gate runners (40-i2, 40'-i2) couples a second set of n+1 MFET gate runners (20-i2) to second terminals of the set of n SFET gate runners (30-i). According to a still yet another embodiment, the first and second sets of n isolation gate runners (40-i1, 40'-i1; 40'-i1, 40'-i2) each comprises 2n+1 isolation gate runner (40-i, 40'-i) connections (92, 91; 96, 95). According to a yet still another embodiment, a first MFET gate runner (20-1) is coupled to a first (30-1) of n SFET gate runners (30-i) by a first isolation gate runner (40-1, 40'-1) and wherein a last (20-(n+1)) MFET gate runner (20-i) is coupled to a last of n SFET gate runner (30-n) by a last isolation gate runner (40-n, 40'-n), According to an additional embodiment, the MOSFET further comprises a body region (47) in which a first (40-1, 40'-1) isolation gate runner is embedded, and further comprising a region (80, 80') of higher doping concentration compared to the body region (37, 47) proximate an outboard side of the first isolation gate runner (40-1, 40'-1) between an outboard side of the first MFET grate runner (20-1) and an outboard side of a first SFET gate runner (30-1). According to a still additional embodiment, the MOSFET further comprises a body region (47) in which a last (40-n, 40'-n) isolation gate runner is embedded, and further comprising a region (80, 80') of higher doping concentration compared to the body region (47) proximate outboard sides of the last isolation gate runner (40-n, 40'-n) between an outboard side of a last MFET grate runner (20-(n+1)) and an outboard side of a last SFET gate runner (30-n). According to a yet additional embodiment, the region (80, 80') of higher doping concentration compared to the body region (47) has a doping concentration exceeding that of the body region (47) proximate outboard sides of the first isolation gate runner (40-1, 40'-1) between an outboard side of the first MFET grate runner (20-1) and an outboard side of the first SFET gate runner (30-i). by a factor of about 20 or more. According to a still yet additional embodiment, the region (80, 80') of higher doping concentration compared to the body region (47) has a doping concentration exceeding that of the body region (47) proximate outboard sides of the last isolation gate runner (40-n, 40'-n) between an outboard side of the last MFET grate runner (20-(n+1)) and an outboard side of the last SFET gate runner (30-n). by a factor of about 20 or more.

According to a second embodiment, there is provided a method for forming a power metal-oxide-semiconductor-field-effect-transistor (MOSFET) (300, 300') having an embedded current sensor-field-effect-transistor (SFET) (304), comprising, providing a substrate (301) having upper (312) and lower (315) surfaces, including therein a body region (27, 37, 47) of the power MOSFET (300, 300'), forming in the upper surface (312) of the substrate (301) multiple gate trenches (230, 330, 430) extending into the body region (27, 37, 47), and with a first group (230) for a main field effect transistor (MFET) (302), a second group (330) for a SFET (304) and a third group (430) with cross-coupled sub-trenches (90, 94), wherein the third group (430) couples the first (230) and second (330) groups of trenches, providing a gate dielectric liners (23, 33, 43) in the gate trenches (230, 330, 430), filling the multiple gate trenches (230, 330, 430) with gate conductor (21, 31, 41);

providing first sources (22) adjacent the first group (230) and second sources (32) adjacent the second group (330) but substantially no sources adjacent the third group (430) of gate trenches (230, 330, 430), providing over the upper surface (312), first source metal (306) coupled to the first sources (22) and second source metal (308) spaced apart from the first source metal (306) and coupled to the second sources (32), providing a drain region (313) proximate the lower surface (315), and providing a gate pad (320) coupled to the gate conductor (21, 31, 41) and a drain contract (314) coupled to the drain region (313). According to a further embodiment, forming the third group (430) with cross-coupling sub-trenches (90, 94) comprises, forming zigzag shaped sub-trenches (90, 94) wherein the gate conductor (31) in the second group (330) of trenches is coupled to the zigs (92, 96) and wherein the gate conductor (21) of the first group of trenches (230) is coupled to the zags (91, 95) of the zigzag shaped sub-trenches (90, 94).

According to third embodiment, there is provided a method (900) for fabricating a power metal-oxide-semiconductor-field-effect-transistor (MOSFET) (300") incorporating a main-field-effect-transistor (MFET) (302) and a current sensing-field-effect-transistor (SFET) (304"), comprising, providing a substrate (301) having upper (312) and lower (315) surfaces, including therein a body region (27, 37, 47) of the power MOSFET (300"), forming in the upper surface (312) of the substrate (301) multiple gate trenches (230, 330, 430) extending into the body region (27, 37, 47), and having a first group (230) for the MFET (302), a second group (330) for the SFET (304") and a third group (430) coupling the first (230) and second (330) groups of trenches, providing dielectric liners (23, 33, 43) in the gate trenches (230, 330, 430), filling the multiple gate trenches (230, 330, 430) with gate conductor (21, 31, 41), providing first sources (22) adjacent the first group (230) and second sources (32) adjacent the second group (330) but substantially no sources adjacent the third group (430) of gate trenches (230, 330, 430), locally increasing the doping in portions (57) of the body regions (27, 37, 57) adjacent the dielectric liners (43) of the third group (40"-i) to exceed the background doping of the body region (27, 37, 47), providing over the upper surface (312), first source metal (306) coupled to the first sources (22) and second source metal (308) spaced apart from the first source metal (306) coupled to the second sources (32), providing a drain region (313) proximate the lower surface (315), and providing a gate pad (320) coupled to the gate conductor (21, 31, 41) and a drain contract (314) coupled to the drain region (313). According to a further embodiment, the step of locally increasing the doping in portions (57) of the body regions (27, 37, 57) adjacent the dielectric liners (43) of the third group (40"-i) to exceed the background doping of the body region (27, 37, 47) comprises increasing to exceed the background doping by a factor of about 20 or more.

According to a fourth embodiment, there is provided a power metal-oxide-semiconductor-field-effect-transistor (MOSFET) (300") incorporating a main-field-effect-transistor (MFET) (302) and a current sensing-field-effect-transistor (SFET) (304"), comprising, a substrate (301) having upper (312) and lower (315) surfaces, wherein the substrate includes a body region (27, 37, 47) of the power MOSFET (300"), multiple gate trenches (230, 330, 430) extending into the body region (27, 37, 47) from the upper surface (312), and having a first group (230) for the MFET (302), a second group (330) for the SFET (304") and a third group (430) coupling the first (230) and second (330) groups of trenches, dielectric liners (23, 33, 43) in the gate trenches (230, 330, 430), gate conductor (21, 31, 41) filling the multiple gate trenches (230, 330, 430), first sources (22) adjacent the first group (230) and second sources (32) adjacent the second group (330) but substantially no sources adjacent the third group (430) of gate trenches (230, 330, 430), wherein the doping in portions (57) of the body regions (27, 37, 57) adjacent the dielectric liners (43) of the third group (40"-i) exceeds the background doping of the body region (27, 37, 47), and first source metal (306) coupled to the first sources (22) and second source metal (308) spaced apart from the first source metal (306) coupled to the second sources (32). According to a further embodiment, the doping in portions (57) of the body regions (27, 37, 57) adjacent the dielectric liners (43) of the third group (40"-i) exceeds the background doping of the body region (27, 37, 47) by a factor of about 20 or more.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way.

Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A power metal-oxide-semiconductor-field-effect-transistor (MOSFET), comprising:
   a substrate having upper and lower surfaces;
   a main field effect transistor (MFET) formed in the substrate, having multiple MFET source regions and MFET gate runners extending to the upper surface, underlying an MFET source metal coupled to the multiple MFET source regions, and a drain region and a drain contact proximate the lower surface;
   a current sensing field effect transistor (SFET) formed in the substrate, having multiple SFET source regions and SFET gate runners extending to the upper surface, underlying an SFET source metal coupled to the multiple SFET source regions, and a drain region and a drain contact proximate to the lower surface, wherein the SFET is laterally embedded within the MFET but separated from the MFET by a buffer region; and
   isolation gate runners located in the buffer region and electrically coupling the MFET gate runners to the SFET gate runners while electrically separating the MFET source regions and the SFET source regions, wherein the isolation gate runners are connected end-to-end such that each of the isolation gate runners has at least one end directly physically connected to an end of an adjacent isolation gate runner, and adjacent isolation gate runners have one common end directly physically coupled to one of the MFET gate runners, and each of the isolation gate runners has a middle portion directly physically connected to one of the SFET gate runners.

2. The power MOSFET of claim 1, wherein the isolation gate runners couple the SFET gate runners together and couple the MFET gate runners together, and further connect the MFET gate runners and the SFET gate runners to each other.

3. The power MOSFET of claim 2, wherein the isolation gate runners have a zigzag like plan view layout configuration, with the SFET gate runners coupled to the zigs and the MFET gate runners coupled to the zags of the isolation gate runners.

4. The power MOSFET of claim 3, wherein the zigzag like plan view layout configuration of the isolation gate runners have a saw-tooth like plan view layout configuration.

5. The power MOSFET of claim 1, wherein a first set of n isolation gate runners couple a first set of n+1 MFET gate runners to first terminals of a set of n SFET gate runners and a second set of n isolation gate runners couple a second set of n+1 MFET gate runners to second terminals of the set of n SFET gate runners, where n is a number.

6. The power MOSFET of claim 5, wherein the first and second sets of n isolation gate runners each comprises 2n+1 isolation gate runner connections.

7. The power MOSFET of claim 5, wherein a first MFET gate runner of the first set of n+1 MFET gate runners is coupled to a first SFET gate runner of the set of n SFET gate runners by a first isolation gate runner of the first set of n isolation gate runners and wherein a $(n+1)^{th}$ MFET gate runner of the first set of n+1 MFET gate runners is coupled to a $n^{th}$ SFET gate runner of the set of n SFET gate runners by a $n^{th}$ isolation gate runner of the first set of n isolation gate runners.

8. The power MOSFET of claim 7, wherein the MOSFET further comprises a first body region in which the first isolation gate runner is embedded, and further comprising a first region of higher doping concentration compared to the first body region proximate to an outboard side of the first isolation gate runner between an outboard side of the first MFET gate runner and an outboard side of the first SFET gate runner, wherein the outboard sides of the first isolation gate runner, the first MFET gate runner and the first SFET gate runner are proximate to a first side of the substrate parallel to the SFET gate runners.

9. The power MOSFET of claim 8, wherein the first region of higher doping concentration compared to the first body region has a doping concentration exceeding that of the first body region proximate to the outboard side of the first isolation gate runner between the outboard side of the first MFET gate runner and the outboard side of the first SFET gate runner by a factor of about 20 or more.

10. The power MOSFET of claim 8, wherein the MOSFET further comprises a second body region in which the $n^{th}$ isolation gate runner is embedded, and further comprising a second region of higher doping concentration compared to the second body region proximate to an outboard side of the $n^{th}$ isolation gate runner between an outboard side of the $(n+1)^{th}$ MFET gate runner and an outboard side of the $n^{th}$ SFET gate runner, wherein the outboard sides of the $n^{th}$ isolation gate runner, the $(n+1)^{th}$ MFET gate runner and the $n^{th}$ SFET gate runner are proximate to a second side opposite to the first side of the substrate.

11. The power MOSFET of claim 10, wherein the second region of higher doping concentration compared to the second body region has a doping concentration exceeding that of the body region proximate to the outboard side of the $n^{th}$ isolation gate runner between the outboard side of the $(n+1)^{th}$ MFET gate runner and the outboard side of the $n^{th}$ SFET gate runner by a factor of about 20 or more.

12. A power metal-oxide-semiconductor-field-effect-transistor (MOSFET) incorporating a main-field-effect-transistor (MFET) and a current sensing-field-effect-transistor (SFET), comprising:
   a substrate having upper and lower surfaces, wherein the substrate includes a body region of the power MOSFET;
   multiple gate trenches extending into the body region from the upper surface, and having a first group for the MFET, a second group for the SFET and a third group coupling the first and second groups of trenches, wherein the gate trenches of the third group are connected end-to-end such that each of the gate trenches of the third group has at least has one end directly connected to an end of an adjacent gate trench of the third group, and adjacent gate trenches of the third group have one common end directly coupled to one of the gate trenches of the first group, and each of the gate trenches of the third group has a middle portion directly connected to one of the gate trenches of the second group;
   dielectric liners in the multiple gate trenches;
   gate conductor filling the multiple gate trenches;
   first sources adjacent to the first group, and second sources adjacent to the second group, wherein doping in portions of the body region adjacent to the dielectric liners of the third group exceeds background doping of the body region; and
   a first source metal coupled to the first sources and a second source metal spaced apart from the first source metal coupled to the second sources.

13. The power MOSFET of claim 12, wherein the doping in portions of the body region adjacent to the dielectric liners of the third group exceeds the background doping of the body region by a factor of about 20 or more.

\* \* \* \* \*